United States Patent

Rieder et al.

[15] 3,649,928

[45] Mar. 14, 1972

[54] OSCILLATOR PHASE CONTROL SOAP PROVIDING COARSE AND FINE TUNING SIGNALS

[72] Inventors: Lorenz Rieder; Klaus Vester, both of Pforzheim, Germany

[73] Assignee: International Standard Electric Corporation, New York, N.Y.

[22] Filed: Aug. 31, 1970

[21] Appl. No.: 68,087

[52] U.S. Cl. ....................................331/10, 331/17, 331/25
[51] Int. Cl. ..........................................................H03b 3/04
[58] Field of Search.............................331/10, 17, 18, 25, 27

[56] References Cited

UNITED STATES PATENTS 3,500,226 3/1970 Eisenberg ............................331/25 X

*Primary Examiner*—Roy Lake
*Assistant Examiner*—Siegfried H. Grimm
*Attorney*—C. Cornell Remsen, Jr., Walter J. Baum, Paul W. Hemminger, Charles L. Johnson, Jr., Philip M. Bolton, Isidore Togut, Edward Goldberg and Menotti J. Lombardi, Jr.

[57] ABSTRACT

This invention provides a circuit arrangement for effecting the phase control of an oscillator with the aid of a flip-flop or gating circuit acting as a phase discriminator. A filter chain provides a returning voltage for causing the phase of the oscillator frequency to coincide with a reference frequency. The pulses of the phase discriminator appearing at the input of the filter chain are applied via a resistor to a capacitor whose charging voltage effects the coarse tuning of the oscillator.

2 Claims, 2 Drawing Figures

INVENTORS

Figure 1:
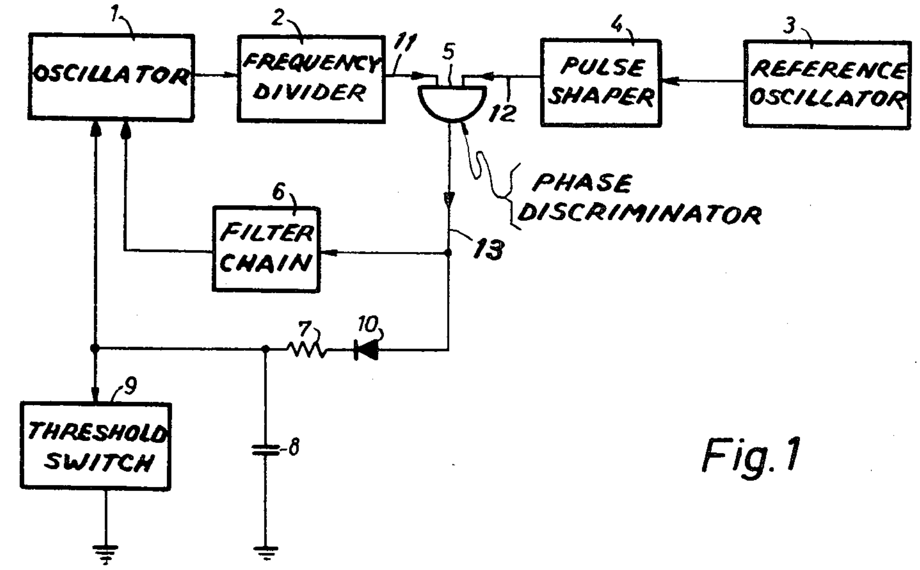

LORENZ RIEDER
KLAUS VESTER

BY [signature]

ATTORNEY

OSCILLATOR PHASE CONTROL SOAP PROVIDING COARSE AND FINE TUNING SIGNALS

The present invention relates to a circuit arrangement for effecting the phase control of an oscillator with the aid of a flip-flop or gating circuit acting as a phase discriminator and which, via a filter chain, supplies a control voltage for causing the oscillator frequency to coincide in phase with a reference frequency.

The employment of flip-flop and gating circuits as phase discriminators instead of the hitherto conventional types of ring and balanced modulators, by the employment of integrated switching circuits, enables an extensive miniaturization of highly constant oscillators. There does result the disadvantage, however, that phase discriminators employing digital assembly stages produce noise voltages whose peak values are likely to reach almost the magnitude of the maximum control voltage. In order to avoid an excessive noise modulation of the oscillator which may lead to inadmissibly strong subsidiary waves, it was hitherto necessary to dimension the filter as arranged in the control line in such a way, that there will result an unfavorable behavior of the control circuit. In order to avoid the drifting of the oscillator frequency out of the phase control range, it is known to employ a search oscillator, with the oscillations thereof commencing as soon as both the oscillator and the comparison or reference frequency, via the phase discriminator, form a beat frequency.

There has also already become known a phase control circuit in which, upon exceeding the control range, the output voltage of the phase discriminator with the beat frequency is rectified, thus causing the charging of a capacitor. The charging voltage of the capacitor then serves the coarse tuning of the oscillator. This process must be repeated continuously, because after a certain period of time, the capacitor will loose its charge (German printed application (DAS) 1,250,478.)

The restoration of the phase control already has a disturbing effect when transmitting spoken messages. In the case of a transmission of digital messages it even leads to an interruption in the flow of information.

The present invention is based on the problem of providing a coarse control safeguarding that the retuning or fine tuning will always remain within the phase control range.

The invention is characterized by the fact that the pulses of the phase discriminator as appearing at the input of the filter chain, are fed, via a resistor, to a capacitor whose charging voltage is used for effecting the coarse tuning of the oscillator.

The inventive type of circuit arrangement offers the advantage that the coarse control is effected continuously and thus prevents the generation of pulses having a high energy content which might become the cause of forming subsidiary waves.

In this way there results the possibility of designing the filter chain in the line serving the fine regulation, with respect to the most favorable control behavior.

One example of embodiment of the inventive type of circuit arrangement will now be described hereinafter with reference to FIGS. 1 and 2 of the accompanying drawings, in which: FIG. 1 shows the block diagram of the FIG. arrangement, and FIG. 2 shows the pulse scheme relating to the phase discriminator.

In the example of embodiment according to FIG. 1 the voltage of the oscillator 1 which is to be stabilized with respect to phase is applied via a digital frequency divider 2, and the voltage of a highly constant reference oscillator 3 is applied via a pulse shaper 4 to the phase discriminator 5 designed as a gate circuit. From this phase discriminator 5 there is taken the voltage for effecting the fine adjustment of the oscillator 1, via a filter chain 6. According to the invention, the pulse-shaped voltage of the phase discriminator, via a resistor 7, is applied to a capacitor 8. This capacitor 8 is charged by the pulses, and supplies the control voltage for effecting the coarse control or regulation. In order to avoid a back discharge of the capacitor 8, it is possible to insert a crystal diode 10.

Figure 2:
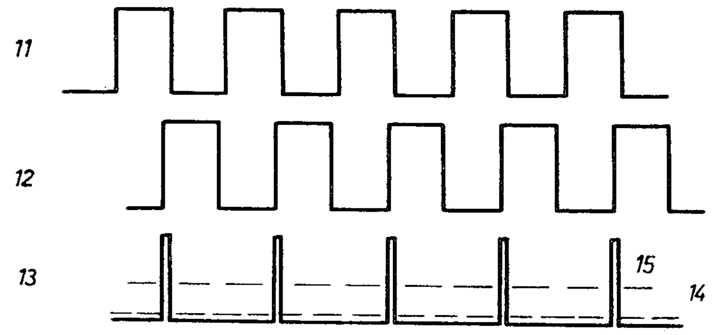

In FIG. 2 a train of pulses 11 shows the output signal of the frequency divider 2, and the train of pulses 12 shows the output signal of the pulse shaper 4 with respect to the regulated condition. The narrow pulses at the output of the phase discriminator 5, which are indicated by the train of pulses 13, produce a control voltage 14 at the output of the filter chain 6, which is sufficient for compensating any existing residual error of the control loop.

The capacitor 8, during the switch-on time of the apparatus, during which there did not exist a phase coincidence or agreement, is charged to the voltage value 15 by substantially broader pulses 13, with this voltage 15 serving the coarse tuning of the oscillator.

After the regulated condition according to FIG. 2 has been reached, the low energy content of the pulses 13 is sufficient for covering the charge losses of the capacitor 8. If, however, there occurs a variation of phase position of the signals to be compared, in the sense that the coarse control voltage must be increased, there will result a broadening or widening of the pulses 13 and, consequently, an increased charging of the capacitor 8. Thereafter, both the coarse and the fine adjustment or regulation are compensated until the pulses 13 again reassume the original width, and until the voltage 15 has again reassumed a correspondingly higher value.

If the phase position of the signals to be compared is varied in the opposite sense, the reduction of the energy contents of the pulses, and the dropping of the voltage 15 as caused thereby, will effect the restoration of the controlled or adjusted condition.

By suitably dimensioning the capacitor 8 it is possible to achieve that the latter continuously requires a recharging, for controlling or regulating the arrangement only in one direction. Upon exceeding a predetermined threshold value, a threshold switch 9 will serve to effect the short-circuiting of the capacitor 8, thus enabling the adjustment to the necessary charging voltage.

Since the pulses 13 are very narrow, the filtering of the fine adjustment voltage by the filter chain 6 will not cause any difficulties, and may be dimensioned in the optimum way in accordance with control-technical points of view. For the same reason there will also not appear any noise modulation of the oscillator 1 which might be the cause of forming subsidiary waves.

What is claimed:

1. A circuit arrangement comprising:

a voltage controlled oscillator;

a frequency divider having its input coupled to the output voltage of the oscillator to be controlled;

a gate having one input coupled from the output of said divider;

a reference oscillator and pulse shaper serially coupled to another input of said gate;

a filter coupled between the output of said gate and an input of said controlled oscillator for effecting the fine adjustment of said controlled oscillator;

a resistor coupled between the output of said gate and another input of said controlled oscillator;

a capacitor coupled to said other input of said controlled oscillator and ground reference, whereby the output of said gate determines the charging voltage of said capacitor to effect the coarse tuning of said controlled oscillator; and a diode serially connected with said resistor to prevent back discharge of said capacitor.

2. The circuit of claim 1 including a threshold switch coupled in parallel with said capacitor to effect short-circuiting of said capacitor and enable adjustment of the charging voltage.

* * * * *

UNITED STATES PATENT OFFICE

CERTIFICATE OF CORRECTION

Patent No. 3,649,928 Dated March 14, 1972

Inventor(s) L. Rieder - K. Vester

It is certified that error appears in the above-identified patent and that said Letters Patent are hereby corrected as shown below:

[54] Change "SOAP" to --LOOP--.

Column 1, line 1, change "SOAP" to --LOOP--.

Signed and sealed this 5th day of December 1972.

(SEAL)
Attest:

EDWARD M.FLETCHER,JR.
Attesting Officer

ROBERT GOTTSCHALK
Commissioner of Patents